United States Patent
Jiang

(10) Patent No.: US 7,266,162 B2
(45) Date of Patent: Sep. 4, 2007

(54) CARRIER FREQUENCY OFFSET ESTIMATOR FOR OFDM SYSTEMS

(75) Inventor: Hong Jiang, Warren, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 808 days.

(21) Appl. No.: 10/174,417

(22) Filed: Jun. 18, 2002

(65) Prior Publication Data
US 2003/0231718 A1 Dec. 18, 2003

(51) Int. Cl.
*H04L 27/00* (2006.01)
(52) U.S. Cl. .................. 375/326; 375/322; 375/329
(58) Field of Classification Search ............ 375/286, 375/326, 329, 348, 316, 322, 324, 346; 370/208, 370/210, 206, 515, 203
See application file for complete search history.

(56) References Cited

U.S. PATENT DOCUMENTS

| | | | | |
|---|---|---|---|---|
| 5,881,099 | A * | 3/1999 | Takahashi et al. | 375/141 |
| 6,061,406 | A * | 5/2000 | Carson et al. | 375/260 |
| 6,172,993 | B1 * | 1/2001 | Kim et al. | 370/516 |
| 6,181,755 | B1 * | 1/2001 | Junell | 375/362 |
| 6,459,679 | B1 * | 10/2002 | Kim | 370/208 |
| 6,490,010 | B1 * | 12/2002 | Shibuya et al. | 348/735 |
| 6,600,795 | B1 * | 7/2003 | Ohta et al. | 375/343 |
| 6,690,680 | B1 * | 2/2004 | Marchok et al. | 370/480 |
| 6,757,344 | B2 * | 6/2004 | Carleton | 375/341 |
| 6,778,589 | B1 * | 8/2004 | Ishii | 375/136 |
| 2002/0021715 | A1 * | 2/2002 | Matheus et al. | 370/480 |
| 2002/0065047 | A1 * | 5/2002 | Moose | 455/63 |
| 2003/0128751 | A1 * | 7/2003 | Vandenameele-Lepla | 375/229 |
| 2003/0142764 | A1 * | 7/2003 | Keevill et al. | 375/341 |
| 2005/0169165 | A1 * | 8/2005 | Cimini et al. | 370/206 |

\* cited by examiner

*Primary Examiner*—Jay K. Patel
*Assistant Examiner*—Naheed Ejaz

(57) ABSTRACT

A frequency offset estimator is employed that estimates the frequency offset in signal frames that include only binary Phase-Shift Keying (BPSK) carriers in OFDM systems. Specifically, the offset frequency estimator takes advantage of those OFDM systems in which some OFDM symbols only have carriers with either zero or the BPSK constellations. In many WLAN systems such as the system described in standard IEEE802.11a, transmission frames include only BPSK symbols, which are used for training and other services. By making use of these BPSK symbols in each frame, a very accurate estimate of frequency offset can be obtained. By advantageously employing the frequency offset estimator of this invention, a carrier recovery system can achieve high performance even under strong ISI and low SNR. In a specific embodiment of the invention, BPSK carriers spread to be on a line in a complex plane at an angle to the real axis. An estimate of the angle of the line including the BPSK carriers is then employed to obtain an estimate of the frequency offset.

8 Claims, 2 Drawing Sheets

CARRIER RECOVERY LOOP

BPSK CARRIERS

BPSK CARRIERS WHEN THERE IS A FREQUENCY OFFSET

CARRIER RECOVERY LOOP

CARRIER FREQUENCY OFFSET ESTIMATOR FOR OFDM SYSTEMS

TECHNICAL FIELD

This invention relates to communication systems and, more particularly, to the estimation of the carrier frequency offset.

BACKGROUND OF THE INVENTION

In communication systems, for example, digital wireless or the like, received data symbols are corrupted by distortion caused by impairments in the communication channel over which they were transmitted and by noise. Additionally, the data symbols are also corrupted by carrier frequency offset caused by disparity in the frequencies of a remote transmitter and a local receiver.

In orthogonal frequency division multiplexing (OFDM) systems, carrier recovery is necessary to compensate the carrier frequency offset at the receiver. As shown in FIG. 1, the carrier recovery typically includes use of a frequency offset estimator 101, a loop filter 102 and a rotator 103. The frequency offset estimator 101 is crucial in the performance of OFDM systems. Most frequency offset estimators 101 employ a certain correlation of the cyclic prefix of OFDM frames, i.e., symbols, in the time domain. While these prior approaches have been widely used, the performance of such frequency offset estimators is sensitive to such factors as length of the cyclic prefix, signal to noise ratio (SNR) and intersymbol interference (ISI). In the presence of intersymbol interference (ISI) the cyclic prefix samples may have large errors because of prior transmitted OFDM samples. Such errors introduce inaccuracy into the estimate of frequency offset in those systems employing the cyclic prefix in the computation. Additionally, these prior approaches to frequency offset estimation are especially disadvantageous in packet transmission systems, one example being a wireless local area network (WLAN), because in such systems, it is important to have an accurate estimate of carrier frequency offset so that the synchronization can be quickly established.

SUMMARY OF THE INVENTION

These and other problems and limitations of the prior known frequency offset estimator arrangements employed in communication systems are overcome by estimating the frequency offset in signal frames that include only binary Phase-Shift Keying (BPSK) carriers in OFDM systems.

Specifically, the offset frequency estimator of this invention takes advantage of those OFDM systems in which some OFDM symbols only have carriers with either zero or the BPSK constellations. In many WLAN systems such as the system described in the IEEE802.11a standard, transmission frames include only BPSK symbols, which are used for training and other services. In other systems so-called training frames are periodically transmitted in which any non-zero data frame is a BPSK frame. By making use of these BPSK frames, a very accurate estimate of frequency offset can be obtained, in accordance with the invention. By advantageously employing the frequency offset estimator of this invention, a carrier recovery system can achieve high performance even under strong ISI and low SNR.

In a specific embodiment of the invention, when there is a frequency offset the BPSK carriers are spread to be on a line in a complex plane at an angle to the real axis. An estimate of the angle relative to the real axis of the line including the BPSK carriers is employed to obtain an estimate of the frequency offset.

DETAILED DESCRIPTION

Theoretical Discussion

It is noted that the embodiment of the invention described below is concerned with carrier recovery only and, therefore, it is assumed that timing recovery is otherwise available so that the location of OFDM frames is known and they are properly aligned.

In an OFDM transmission system, the transmitted data stream is made up of frames, i.e., symbols. Each frame includes L+N samples, where the first L samples are the cyclic prefix, and the later N samples are transmitted data. Typically, N>>L. The L samples, which make up the cyclic prefix, are effectively removed, from the process, e.g., by ignoring them, and the remaining N data samples are used to determine the frequency offset estimate. For example, in a software implementation the bit positions containing the cyclic prefix are ignored, and in an integrated circuit implementation the bits in the cyclic prefix bit positions would be inhibited or otherwise suppressed. In some OFDM transmission systems, such as the system defined in the IEEE802.11a standard, training frames are periodically transmitted. In such training frames, the only non-zero carriers are BPSK carriers. Here, the BPSK carriers are referred to as the carriers whose constellation lie either on the real axis or the imaginary axis in an imaginary plane. Since N>>L, significantly more samples are used in this invention to compute the frequency offset estimate. This significantly increases the likelihood that a correct estimate is obtained. Additionally, since the cyclic prefix samples are not employed in computing the frequency offset estimate, the result is more immune to the presence of ISI.

Figure 1:
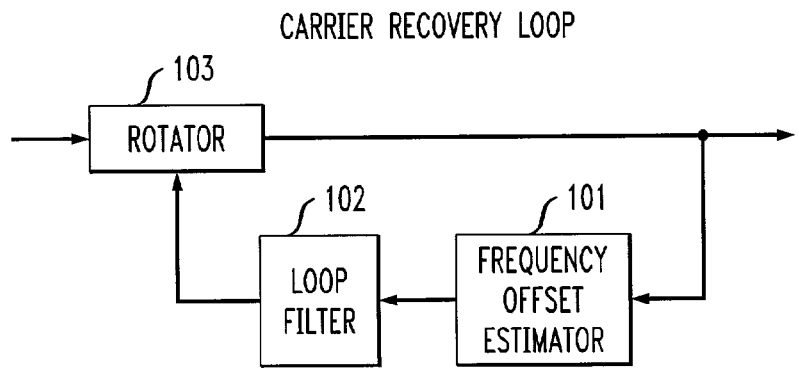
FIG. 1 shows, in simplified block diagram form, details of a prior art carrier recovery arrangement.
Figure 2A:
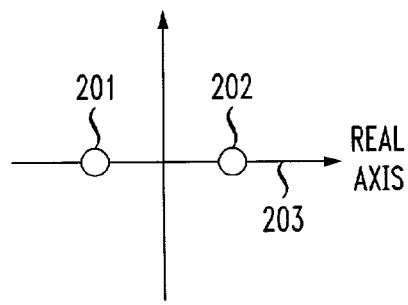
FIGS. 2A and 2B illustrate the ideal positions of BPSK carriers on the real axis and imaginary axis of a complex plain without any frequency offset.
Figure 2B:
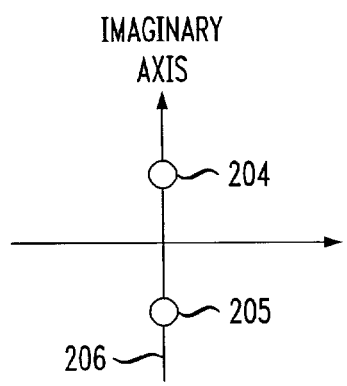
Figure 3:
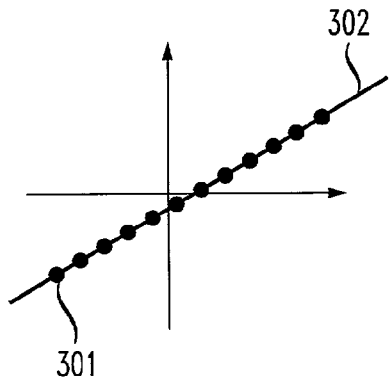
FIG. 3 illustrates the positions of the BPSK carriers on a line at an angle to the real axis of the imaginary plane in the presence of frequency offset.

As indicated above, in OFDM transmission systems training frames are periodically transmitted. In such training frames the only non-zero carries are BPSK carriers. These carriers are complex numbers and are here referred to as the carriers whose constellation lies either on the real axis or the imaginary axis in the complex plane. It is these BPSK frames that are used in generating the offset frequency estimate, in accordance with the invention. In the ideal channel, where no impairments are present such as carrier frequency dots 201 and 202 on the Real Axis 203 or carrier frequency dots 204 and 205 on the Imaginary Axis 206 of the complex plane, as shown in FIG. 2A and FIG. 2B, respectively. If a frequency offset is introduced in the ideal channel, then the non-zero carriers of a BPSK frame are no longer located at the two dots, as shown in FIGS. 2A and 2B. Instead, the carrier frequency dots 301 spread out in a line 302 on the complex plane, as shown in FIG. 3. The angle of the line 302, a so-called constellation line, on which the non-zero carriers lie relative to the real or imaginary axis is a function of the frequency offset. Therefore, an estimate of the angle of this constellation line 302 yields an estimate of the frequency offset.

Estimate of Constellation Line Angle

The estimate of the angle of the constellation line can be performed by a maximum likelihood algorithm. Let $$r = x_i + jy_i, \; i=0, 1, \ldots N-1 \tag{1}$$

be the carriers of a BPSK frame and j is the imaginary unity. Then, let $$x_a = \frac{\Sigma x_i}{N} \tag{2}$$

be the mean value of the real parts of the carriers, and let $$y_a = \frac{\Sigma y_i}{N} \tag{3}$$

be the mean value of the imaginary parts of the carriers. Then, the angle of the constellation line $\phi$ can be estimated as $$\tan(\phi) = \frac{\sum (x_i - x_a)(y_i - y_a)}{\sum (x_i - x_a)^2}. \tag{4}$$

Frequency Offset Detector

Once the angle of the constellation line is determined it may be used to generate an estimate of the frequency offset. Let $\phi_n$ be the angle estimate of the nth BPSK frame, and $\phi_{n+1}$ be the estimate of the angle in the next BPSK frame, then the frequency offset is proportional to $$\epsilon = \phi_{n+1} - \phi_n. \tag{5}$$

EMBODIMENT

Figure 4:
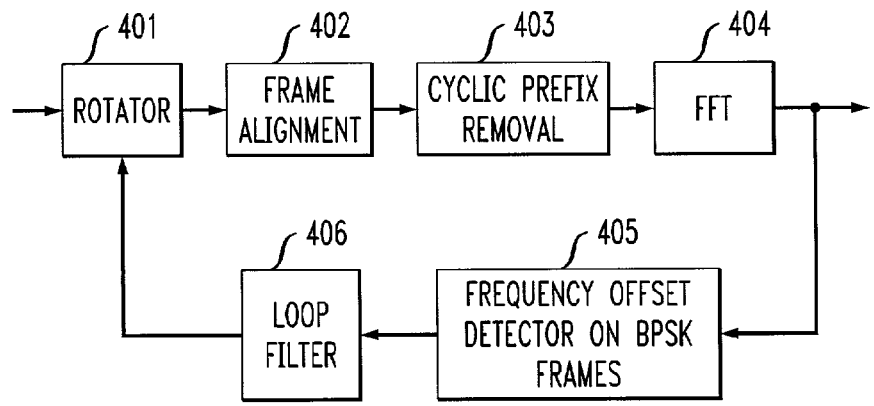
FIG. 4 shows, in simplified block diagram form, details of a carrier recovery system including an embodiment of the invention.

FIG. 4 shows, in simplified block diagram form, details of a carrier recovery system including an embodiment of the invention. Thus, an incoming carrier frequency is supplied to rotator 401. Rotator 401 is responsive to the frequency offset estimate to controllably adjust the carrier frequency, in known fashion. The frequency adjusted output from rotator 401 is supplied to frame alignment unit 402 that synchronizes to the incoming signal frames. Then, the cyclic prefix is effectively removed from the frames via cyclic prefix removal unit 403, which essentially ignores them, also in known fashion. Then, a fast Fouier transform (FFT) is made of the frames less the cyclic prefixes. That is, the FFT is made on the N data samples remaining in each of the frames. Once the FFT is made each frame includes N carriers that are complex numbers. Details of frequency offset detector 405 are described below in relationship to FIG. 5. These N carriers are supplied as an output and to frequency offset detector 405. It is noted that in some OFDM systems training frames are periodically transmitted. In such training frames, the only non-zero carriers are BPSK carriers. As indicated above, in this example, the BPSK carriers are those carriers having their constellation lie either on the real axis or the imaginary axis in the imaginary plane. Frequency offset detector 405 generates an error signal which is the estimate of frequency offset, namely, $\epsilon$, which is supplied via loop filter 406 to a control input of rotator 401. Thus, in some systems all the frames are BPSK frames while in other systems the BPSK frames are periodically transmitted. Consequently, in the systems that the BPSK frames are transmitted periodically frequency offset detector 405 must detect which frames are BPSK frames.

Figure 5:
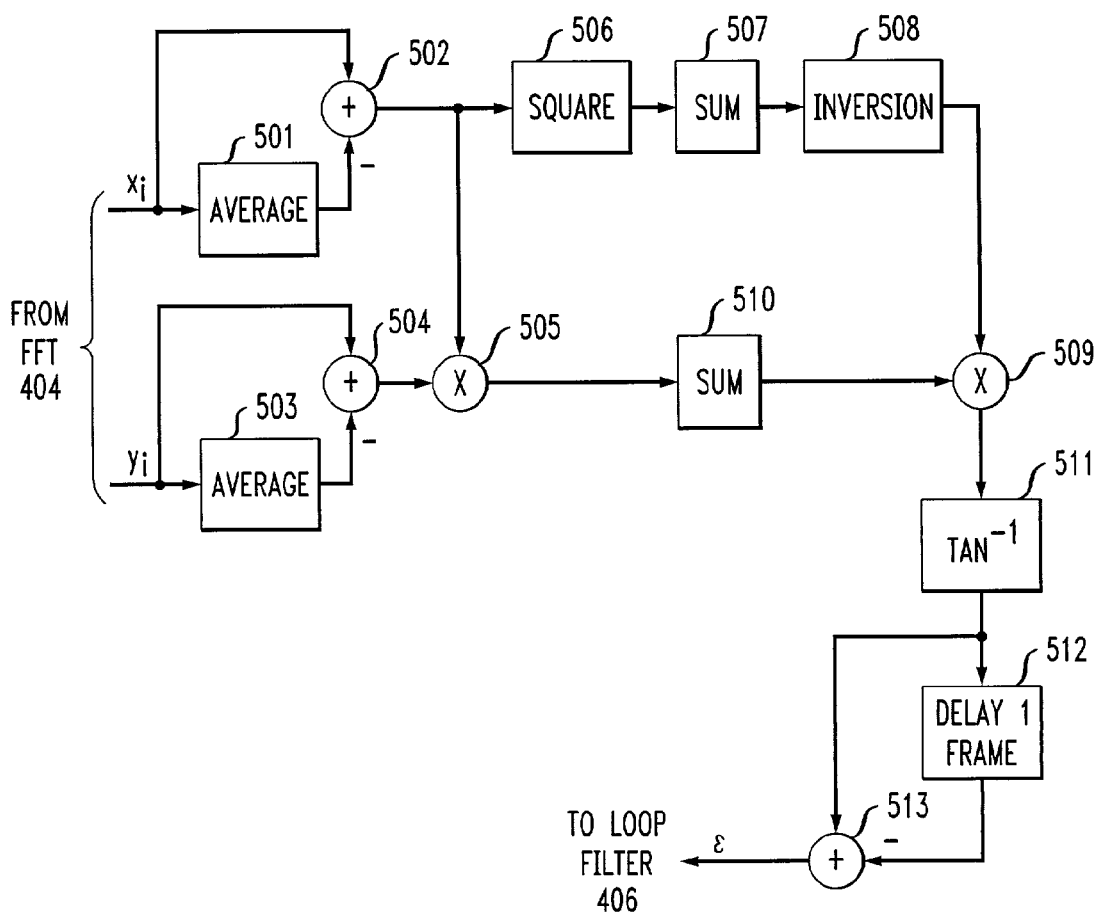
FIG. 5 shows, in simplified block diagram form, details of a frequency offset detector that may be employed in the embodiment shown in FIG. 4.

FIG. 5 shows, in simplified block diagram form, details of a frequency offset detector 405 that may be employed in the embodiment shown in FIG. 4. Specifically, signal representations of $x_i$ and $y_i$ from FFT 404 are supplied as inputs to detector 405. Then, $x_i$ is supplied to averaging unit 501 and to a positive input of algebraic summer 502. Similarly, $y_i$ is supplied to averaging unit 503 and a positive input of algebraic summer unit 504. An output from averaging unit 501 is representative of equation (2) and is supplied to a negative input of algebraic summer unit 502 and an output from averaging unit 503 is representative of equation (3) and is supplied to a negative input of algebraic summer unit 504. The output of summer 502 ($x_i - x_a$) is supplied to an input of multiplier 505 and to squaring unit 506. The squared outputs from squaring unit 506 are summer in sum unit 507 and inverted in inversion unit 508 The output of inversion unit 508 is supplied to one input of multiplier 509. The output from multiplier 505 ($x_i - x_a$)($y_i - y_a$) is summed via sum unit 510 and supplied to a second input of multiplier 509. The output from multiplier 511 represents tan ($\phi$) of equation (4). Thereafter, angle $\phi_n$ is obtained by reverse tangent unit (Tan$^{-1}$) 511, in well known fashion. A presentation of angle $\phi_n$ is supplied to delay unit 512 and to a positive input of algebraic summer 513. The delayed output of delay unit 512 is representative of $\phi_{n-1}$, i.e., angle $\phi_n$ delayed by one frame interval, and is supplied to a negative input of algebraic summer unit 513. Letting $\phi_{n-1}$ be the current angle value and $\phi_n$ be the next angle value, summer 513 yields the frequency offset $\epsilon = \phi_{n+1} - \phi_n$ of equation (5). That is, $\phi_{n+1} - \phi_n$ is the equivalent of $\phi_n - \phi_{n-1}$.

The above-described embodiments are, of course, merely illustrative of the principles of the invention. Indeed, numerous other methods or apparatus may be devised by those skilled in the art without departing from the spirit and scope of the invention. Indeed, it will be apparent to those skilled in the art that the invention may be implemented in hardware and/or software. That is, implementation may be in an integrated circuit or in a programmed microprocessor or the like. Another implementation can be in a programmed digital signal processor (DSP).

I claim:

1. A method for recovering a carrier of a received signal including a plurality of frames, the plurality of frames including prescribed frames having a cyclic prefix and data samples and a plurality of non-zero carriers, the method comprising the steps of:

effectively removing said cyclic prefix from said prescribed frames;

determining an angle of a line relative to a predetermined axis in a complex plane on which a constellation of the non-zero carriers of each of said prescribed frames lie, wherein said complex plain has a real axis and an imaginary axis and said predetermined axis is said real axis, and wherein said angle is between said line and said real axis;

utilizing said angle to obtain a value of said carrier frequency offset;

fast Fourier transforming (FFT) each of said prescribed frames after the cyclic prefix has been effectively removed to obtain real and imaginary parts of the resulting carriers of each of the prescribed frames, and using said real parts and said imaginary parts to obtain an estimate of said angle; and recovering the carrier using said carrier frequency offset, wherein said non-zero carriers are binary phase shift keyed (BPSK) modulated and each of said non-zero carriers in a prescribed frame has a real part $x_i$ and an imaginary part $y_i$, wherein i=0, . . . N−1 represents the carriers and said angle $\phi$ is determined in accordance with $$\tan(\phi) = \frac{\sum (x_i - x_a)(y_i - y_a)}{\sum (x_i - x_a)^2}, \text{ where}$$

$$x_a = \frac{\Sigma x_i}{N},$$

is the mean value of the real parts of the carriers, and $$y_a = \frac{\Sigma y_i}{N},$$

is the mean value of the imaginary parts of the carriers.

2. The method as defined in claim 1 comprising a step of detecting which of the plurality of frames are prescribed frames.

3. The method as defined in claim 1 wherein said step of determining said angle $\phi$ includes a step of generating the inverse tan (Tan$^{-1}$) of tan($\phi$), and wherein said step of utilizing includes the steps of delaying a representation of said angle $\phi$ by one frame interval and subtracting said delayed representation from a current representation of said angle $\phi$ to yield said frequency offset estimate $\epsilon$.

4. Apparatus for recovering a carrier of a received signal including a plurality of frames, the plurality of frames including prescribed frames having a cyclic prefix and data samples and a plurality of non-zero carriers, the apparatus comprising:

an inhibit unit to effectively remove said cyclic prefix from said prescribed frames;

an angle generator to generate a value of an angle of a line relative to a predetermined axis in a complex plane on which a constellation of the non-zero carriers of each of said prescribed frames lie, wherein said complex plain has a real axis and an imaginary axis and said predetermined axis is said real axis, and wherein said angle is between said line and said real axis;

an estimator for using values of said angle to obtain a value of said carrier frequency offset;

a fast Fourier transform (FFT) generator for performing an FFT on each of said prescribed frames after the cyclic prefix has been effectively removed to obtain real and imaginary parts of the resulting carriers of each of said prescribed frames, the angle generator using said real parts and said imaginary parts to obtain an estimate of said angle; and a carrier recovery circuit for recovering the carrier using said carrier frequency offset, wherein said non-zero carriers are binary phase shift keyed (BPSK) modulated and each of said non-zero carriers in a prescribed frame has a real part $x_i$ and an imaginary part $y_i$, wherein i=0, . . . N−1 represents the carriers and a value of said angle $\phi$ is generated in accordance with $$\tan(\phi) = \frac{\sum (x_i - x_a)(y_i - y_a)}{\sum (x_i - x_a)^2}, \text{ where}$$

$$x_a = \frac{\Sigma x_i}{N},$$

is the mean value of the real parts of the carriers, and $$y_a = \frac{\Sigma y_i}{N},$$

is the mean value of the imaginary parts of the carriers.

5. The apparatus as defined in claim 4 comprising a detector to detect which of the plurality of frames are prescribed frames.

6. The apparatus as defined in claim 4 wherein said angle generator includes an inverse tan (Tan$^{-1}$) generator for generating the inverse of tan($\phi$) to obtain said value of said angle, and wherein said estimator includes a delay unit for delaying a representation of said angle $\phi$ by one frame interval and a subtractor for subtracting said delayed representation from a current representation of said angle $\phi$ to yield said frequency offset estimate $\epsilon$.

7. Apparatus for use in obtaining a carrier frequency offset of a received signal including a plurality of frames, the plurality of frames including prescribed frames having a cyclic prefix and data samples and a plurality of non-zero carriers, the apparatus comprising:

means for effectively removing said cyclic prefix from said prescribed frames;

means for determining an angle of a line relative to a predetermined axis in a complex plane on which a constellation of the non-zero carriers of each of said prescribed frames lie;

means for utilizing said angle to obtain a value of said carrier frequency offset; and means for fast Fourier transforming (FFT) each of said prescribed frames after the cyclic prefix has been effectively removed to obtain real imaginary parts of the resulting carriers of each of the prescribed frames, the means for determining an angle using said real parts and said imaginary parts to obtain an estimate of said angle, wherein said non-zero carriers are binary phase shift keyed (BPSK) modulated and said complex plain has a real axis and an imaginary axis and said predetermined axis is said real axis, wherein said angle is between said line and said real axis, and each of said non-zero carriers in a prescribed frame has a real part $x_i$ and an imaginary part $y_i$, wherein i=0, . . . N−1 represents the carriers and said angle $\phi$ is determined in accordance with $$\tan(\phi) = \frac{\sum (x_i - x_a)(y_i - y_a)}{\sum (x_i - x_a)^2}, \text{ where}$$

$$x_a = \sum x_i/N,$$

is the mean value of the real parts of the carriers, and $$y_a = \sum y_i/N,$$

is the mean value of the imaginary parts of the carriers.

8. The apparatus as defined in claim 7 wherein said means for determining an angle includes an inverse tan ($Tan^{-1}$) generator for generating the inverse of tan($\phi$) to obtain said value of said angle, and wherein said means for utilizing said angle includes a delay unit for delaying a representation of said angle $\phi$ by one frame interval and a subtractor for subtracting said delayed representation from a current representation of said angle $\phi$ to yield said frequency offset estimate $\epsilon$.

* * * * *